United States Patent
Nishikawa et al.

(10) Patent No.: US 7,839,084 B2
(45) Date of Patent: Nov. 23, 2010

(54) ORGANIC EL ELEMENT AND ORGANIC EL PANEL

(75) Inventors: Ryuji Nishikawa, Gifu (JP); Tetsuii Omura, Gifu (JP)

(73) Assignee: Sanyo Electric Co., Ltd. (JP)

( * ) Notice: Subject to any disclaimer, the term of this patent is extended or adjusted under 35 U.S.C. 154(b) by 287 days.

(21) Appl. No.: 12/187,105

(22) Filed: Aug. 6, 2008

(65) Prior Publication Data

US 2008/0297043 A1    Dec. 4, 2008

Related U.S. Application Data

(63) Continuation of application No. 10/953,667, filed on Sep. 29, 2004, now Pat. No. 7,531,958.

(30) Foreign Application Priority Data

Sep. 30, 2003   (JP)   ............................. 2003-342665
Sep. 22, 2004   (JP)   ............................. 2004-275673

(51) Int. Cl.
   *H05B 33/04*   (2006.01)
(52) U.S. Cl. ...................................... 313/506; 313/504
(58) Field of Classification Search ......... 313/498–512; 428/690
   See application file for complete search history.

(56) References Cited

U.S. PATENT DOCUMENTS

| | | | |
|---|---|---|---|
| 5,405,710 | A | 4/1995 | Dodabalapur et al. |
| 5,554,911 | A | 9/1996 | Nakayama et al. |
| 5,757,126 | A | 5/1998 | Harvey, III et al. |
| 6,111,270 | A | 8/2000 | Xu et al. |
| 6,445,005 | B1 | 9/2002 | Yamazaki et al. |
| 6,505,901 | B1 | 1/2003 | Fukuda |
| 6,639,250 | B1 | 10/2003 | Shimoda |
| 6,670,772 | B1 | 12/2003 | Arnold et al. |

(Continued)

FOREIGN PATENT DOCUMENTS

EP   0 615 401   9/1994

(Continued)

OTHER PUBLICATIONS

Notice of Grounds for Rejection for Japanese Patent Application No. 2004-275673 with English translation mailed Feb. 16, 2010.

(Continued)

*Primary Examiner*—Nimeshkumar D Patel
*Assistant Examiner*—Anne M Hines
(74) *Attorney, Agent, or Firm*—Cantor Colburn LLP

(57) ABSTRACT

A light-emitting device may include a light-emitting element, a microresonator, and a color filter. The light-emitting element may include first and second electrode and an emissive layer provided between the first and second electrodes, and may emit light of a predetermined color when a voltage is applied between the first and second electrodes to allow a current to flow in the emissive layer. The microresonator may repetitively reflect light of a predetermined color emitted from the emissive layer within an interval having an optical length corresponding to the predetermined color, and thereby intensifying and selecting the light of the predetermined color. The color filter may pass the light intensified and selected by the microresonator and further limiting to light having a wavelength of the predetermined color.

14 Claims, 11 Drawing Sheets

U.S. PATENT DOCUMENTS

| | | |
|---|---|---|
| 6,710,541 B2 | 3/2004 | He et al. |
| 6,737,800 B1 | 5/2004 | Winters et al. |
| 6,791,261 B1 | 9/2004 | Shimoda et al. |
| 6,812,637 B2 | 11/2004 | Cok et al. |
| 6,841,803 B2 | 1/2005 | Aizawa et al. |
| 6,906,457 B2 | 6/2005 | Song et al. |
| 7,030,553 B2 * | 4/2006 | Winters et al. ............ 313/504 |
| 2002/0113548 A1 | 8/2002 | Silvernail |
| 2003/0107314 A1 | 6/2003 | Urabe et al. |
| 2003/0146696 A1 | 8/2003 | Park et al. |
| 2004/0051447 A1 | 3/2004 | Okinaka et al. |
| 2004/0147200 A1 | 7/2004 | Urabe et al. |
| 2005/0040756 A1 | 2/2005 | Winters et al. |
| 2005/0067945 A1 | 3/2005 | Nishikawa et al. |
| 2005/0067954 A1 | 3/2005 | Nishikawa et al. |
| 2005/0088085 A1 | 4/2005 | Nishikawa et al. |
| 2005/0099113 A1 | 5/2005 | Yamada |

FOREIGN PATENT DOCUMENTS

| | | |
|---|---|---|
| JP | 63-148597 | 6/1988 |
| JP | 8-8061 | 1/1996 |
| JP | 2001-217072 | 8/2001 |
| JP | 2002-246185 A | 8/2002 |
| JP | 2003-187975 | 7/2003 |
| JP | 2003-234186 A | 8/2003 |
| JP | 2003-272885 A | 9/2003 |
| KR | 2003-0002182 | 1/2003 |
| WO | 00-76010 | 12/2000 |

OTHER PUBLICATIONS

"Study of Organic EL Materials and Devices from Basis to Frontier" from Molecular Electronics and Bioelectronics, Dec. 16, 17, 1993, pp. 135-143.

Partial Translation of Section 3 of Technical Document of Molecular Electronics and Bioelectronics discussed in Third Seminar given in (1993), entitled "elements Having Optical Cavity Structure."

Office Action for corresponding Korean Patent Application No. 10-2004-76414, mailed Aug. 10, 2006, with its excerpt English Translation.

Office Action for corresponding Korean Patent Application No. 10-2004-77132, mailed Apr. 26, 2006, with its excerpt English Translation.

Office Action for corresponding Korean Patent Application No. 10-2004-76977, mailed Apr. 25, 2005, with its excerpt English Translation.

Notice of Grounds for rejection for Korean Patent Application No. 10-2005-52411 with English translation mailed Oct. 20, 2006.

Office Action for U.S. Appl. No. 10/952,645 mailed Feb. 25, 2008.

Office Action for U.S. Appl. No. 10/952,645 mailed Apr. 2, 2007.

Office action dated Jun. 26, 2006 for related U.S. Appl. No. 10/954,092.

Office Action for related U.S. Appl. No. 10/854,092, dated Jan. 6, 2006.

Japanese Patent Laid-Open Publication No. Hei-60275381 and its English excerpt.

* cited by examiner

| REFLECTIVE FILM | | |
|---|---|---|
| RED EL | GREEN EL | BLUE EL |
| SEMI-TRANSMISSIVE FILM | | |
| RED CF | GREEN CF | BLUE CF |

Fig. 10

| REFLECTIVE FILM | | | |
|---|---|---|---|
| WHITE EL | | | |
| SEMI-TRANSMISSIVE FILM | | | TRANSMISSIVE ELECTRODE |
| RED CF | GREEN CF | BLUE CF | |

Fig. 11

ORGANIC EL ELEMENT AND ORGANIC EL PANEL

CROSS-REFERENCE TO RELATED APPLICATIONS

The present application is a continuation application under 35 U.S.C. §120 of U.S. application Ser. No. 10/953,667 filed on Sep. 29, 2004, priority to which is claimed herein and the contents of which are incorporated herein by reference. U.S. application Ser. No. 10/953,667 claims priority to Japanese Application No. 2003-342665, filed on Sep. 30, 2003, and Japanese Application No. 2004-275673, filed on Sep. 22, 2004, priority to both of which is claimed herein, and the contents of both of which are incorporated herein by reference.

BACKGROUND OF THE INVENTION

1. Field of the Invention

The present invention relates to an organic EL element which comprises a transparent electrode, an organic emissive layer disposed over the transparent electrode, and a counter electrode disposed over the organic emissive layer, and emits light when a voltage is applied between the transparent electrode and the counter electrode.

2. Description of the Related Art

In recent years, organic electroluminescence (hereinafter referred to as "EL") displays have gained attention as one type of flat display which would replace liquid crystal displays in the coming generation. In a display panel of an organic EL display (hereinafter referred to as "organic EL panel"), the color of light emitted from each pixel may be determined depending on the emissive material used in the organic emissive layer of each pixel. By allowing the pixels to emit light of different colors using different emissive materials, RGB indication can be achieved.

However, when employing this method, the panel manufacturing process becomes difficult and complex because measures must be effected to compensate for differences in emissive efficiency of the emissive materials for different colors, and steps for applying different emissive materials to corresponding pixels must be carried out separately.

In order to achieve full color indication, other methods for determining pixel colors are proposed. In such methods, light of a single color alone is initially emitted, and color filters or color conversion layers are employed to obtain light of other colors. However, according to these methods, it is difficult to achieve sufficient emissive efficiency for each color.

Another alternative method using microcavities is disclosed in the following document: Takahiro NAKAYAMA and Atsushi KADOTA, "Element Incorporating Optical Resonator Structure, Third Meeting (1993)", in "From the Basics to the Frontiers in the Research of Organic EL Materials and Devices", Dec. 16 and 17, 1993, Tokyo University Sanjo Conference Hall, Japan Society of Applied Physics, Organic Molecular Electronics and Bioelectronics Division, JSAP Catalog Number AP93 2376, p. 135-143. According to this method, a microcavity which functions as a microresonator is provided in each pixel to extract light having a specific wavelength. Using this microresonator, light having a specific wavelength can be selectively intensified.

However, an EL element configured with a conventional microresonator disadvantageously has high dependency on viewing angle, such that unintended colors are detected when the element is viewed at an angle. Further, in order to select light having a specific wavelength using a conventional microresonator, the optical length of the microcavity must be set precisely, resulting in difficulties in the manufacturing process.

SUMMARY OF THE INVENTION

According to the present invention, a microresonator (microcavity) is provided in a portion of a pixel having an organic EL element. Light ejected through a semi-transmissive film is thereby limited to a specific wavelength while the specific wavelength is intensified. The light obtained after the wavelength selection by the microresonator is subsequently passed through a color filter so as to further restrict the wavelength. According to this arrangement, viewing angle dependency of a displayed color can be eliminated significantly. Furthermore, the required precision concerning the thickness of the EL element portion constituting the microresonator can be reduced, facilitating the panel manufacturing process.

In place of the color filter, a color conversion layer may alternatively be employed to convert light of a specific color into light of another color. When using color conversion layers, microresonators in the respective pixels can be configured to intensify light of one specific color alone.

BRIEF DESCRIPTION OF THE DRAWINGS

FIGS. 8-11 are schematic diagrams showing example pixel configurations of an organic EL panel.

DESCRIPTION OF THE PREFERRED EMBODIMENTS

Figure 1:
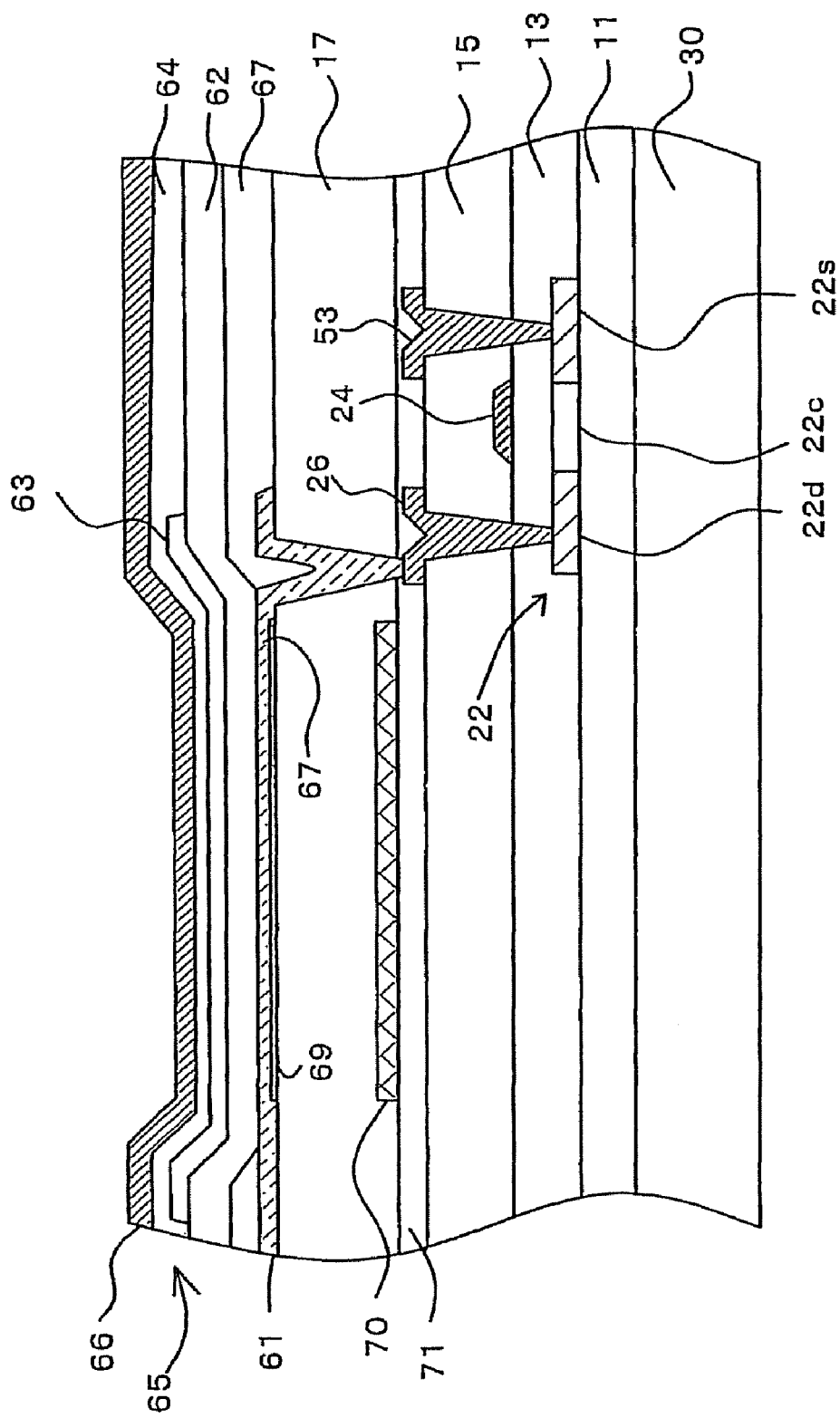
FIG. 1 is a cross-sectional view showing a configuration of a pixel portion of an organic EL element according to the present invention.

Preferred embodiments of the present invention will next be described referring to the drawings.

FIG. 1 is a cross-sectional view showing a configuration of a light-emitting region and a drive TFT (thin film transistor) within one pixel. It should be noted that each pixel actually includes a plurality of TFTs. The drive TFT is the TFT which controls a current supplied from a power line to an organic EL element within the pixel. On a glass substrate 30, a buffer layer 11 composed of a lamination of an SiN layer and an $SiO_2$ layer is formed over the entire surface. Further on top, an active layer 22 made of polysilicon is disposed in predetermined areas (where TFTs are to be created).

Covering the active layer 22 and the buffer layer 11, a gate insulation film 13 is formed over the entire surface. The gate insulation film 13 may be formed by laminating an SiO$_2$ layer and an SiN layer. On top of the gate insulation film 13 at a position above a channel region 22c, a gate electrode 24 composed of chromium or the like is arranged. Subsequently, impurities are doped into the active layer 22 while using the gate electrode 24 as a mask. As a result of this process, in the active layer 22, the channel region 22c without impurities is provided in the central portion under the gate electrode 24, while a source region 22s and a drain region 22d doped with impurities are formed on both sides of the channel region 22c.

Next, covering the gate insulation film 13 and the gate electrode 24, an interlayer insulation film 15 is formed over the entire surface. Contact holes are then created in the interlayer insulation film 15 at positions corresponding to the source region 22s and the drain region 22d located under the interlayer insulation film 15. Subsequently, a source electrode 53 and a drain electrode 26 are provided through these contact holes and on the upper surface of the interlayer insulation film 15, so as to connect with the source region 22s and the drain region 22d, respectively. It should be noted that the source electrode 53 is connected to a power line (not shown). While the drive TFT formed as described above is a p-channel TFT in this example, the drive TFT may alternatively be constituted as an n-channel TFT.

Covering the interlayer insulation film 15, source electrode 53, and drain electrode 26, a film 71 of SiN or the like is formed over the entire surface. A color filter 70 is next formed on top of the SiN film 71 at a position corresponding to the light-emitting region in each pixel.

Covering the SiN film 71 and the color filter 70, a planarization film 17 is provided over the entire surface. On top of the planarization film 17 at the position of the light-emitting region, a semi-transmissive film 69 composed of a thin film of Ag or the like is formed. A transparent electrode 61 which serves as an anode is then disposed on the semi-transmissive film 69. At a position above the drain electrode 26, a contact hole is created through the planarization film 17. The drain electrode 26 and the transparent electrode 61 are connected via this contact hole.

While an organic film such as acrylic resin is typically used to form the interlayer insulation film 15 and planarization film 17, it is also possible to employ TEOS or an inorganic film. A metal such as aluminum may be favorably used to create the source electrode 53 and drain electrode 26. For the transparent electrode 61, ITO is typically employed.

The transparent electrode 61 normally has a substantially rectangular overall shape with a contacting portion protruding laterally and downward through the contact hole for connection with the drain electrode 26. As can be seen in FIG. 1, the semi-transmissive film 69 is formed slightly smaller than the anode 61.

An organic layer 65 and a counter electrode 66 are arranged on top of the transparent electrode 61. The organic layer 65 comprises a hole transport layer 62 formed over the entire surface, an organic emissive layer 63 formed slightly larger than the light-emitting region, and an electron transport layer 64 formed over the entire surface. The counter electrode 66, which serves as a cathode, is made of metal such as aluminum, and is formed over the entire surface.

A planarization film 67 is provided at a position on the upper surface of the peripheral portion of the transparent electrode 61 and underneath the hole transport layer 62. The planarization film 67 limits the portion in which the hole transport layer 62 directly contacts the transparent electrode 61, thereby defining the light-emitting region in each pixel. It should be noted that, while an organic film such as acrylic resin is typically used for the planarization film 67, it is also possible to employ TEOS or an inorganic film.

The hole transport layer 62, the organic emissive layer 63, and the electron transport layer 64 are composed of materials that are conventionally used in an organic EL element. The color of emitted light is determined depending on the material (usually the dopant) of the organic emissive layer 63. For example, the hole transport layer 62 may be composed of NPB, the organic emissive layer 63 for emitting red light may be composed of TBADN+DCJTB, the organic emissive layer 63 for emitting green light may be composed of Alq$_3$+CFD-MQA, the organic emissive layer 63 for emitting blue light may be composed of TBADN+NPB, and the electron transport layer 64 may be composed of Alq$_3$.

In the above-described arrangement, when the drive TFT is turned on by a voltage set in the gate electrode 24, current from the power line flows from the transparent electrode 61 to the counter electrode 66. This current causes light emission in the organic emissive layer 63. The emitted light passes through the transparent electrode 61, planarization film 17, interlayer insulation film 15, gate insulation film 13, and glass substrate 30, to be ejected downward in FIG. 1.

In the present embodiment, a semi-transmissive film 69 composed of a thin film of silver (Ag) or the like is provided on the underside of the transparent electrode 61 at the position of the light-emitting region. Accordingly, light generated in the organic emissive layer 63 is reflected by the semi-transmissive film 69. Because the counter electrode 66 functions as a reflective layer, the light is repetitively reflected between the semi-transmissive film 69 and the counter electrode 66.

The interval structure between the semi-transmissive film 69 and the counter electrode 66 is configured such that this interval optically functions as a microresonator for a specific color. In other words, the optical length of the interval is set to a value obtained by multiplying the wavelength of a desired color by an integer or a reciprocal of an integer (such as ½, 1, and 2). For example, the values of refractive index for the materials constituting each layer in the interval may be approximately as follows: 1.9 for ITO constituting the transparent electrode 61; 1.46 for SiO$_2$ constituting the gate insulation film 13; 2.0 for SiN also used for the gate insulation film 13; and 1.7 for an organic layer including the organic emissive layer 63. By multiplying the physical thickness of each layer between the semi-transmissive film 69 and the counter electrode 66 by a corresponding refractive index, and then summing the calculated values, the optical thickness of the interval can be obtained. In the present embodiment, this optical thickness is set to a value relative to the wavelength of light to be extracted. With this arrangement, the interval between the semi-transmissive film 69 and the counter electrode 66 functions as a microresonator, and enables efficient extraction of light having a desired wavelength. More specifically, light emitted from the organic emissive layer 63 is repetitively reflected between the semi-transmissive film 69 and the counter electrode 66, and as a result, light components having a specific wavelength are selectively passed through the semi-transmissive film 69. By further repeating such reflection within the microresonator, the probability that light having the specific frequency will be ejected can be increased, resulting in enhanced efficiency.

According to the present embodiment, the color filter 70 is arranged in a layer between the interlayer insulation film 15 and the planarization film 17. The color filter 70 may be composed of a material such as a photosensitive resin or polymer having a pigment mixed therein, similar to color filters used in a liquid crystal display and a CCD camera.

The color filter 70 serves to selectively pass the ejected light so as to limit the wavelength of the obtained light, thereby enabling reliable control of the obtained color. When the microresonator limits light passing through the semi-transmissive film 69 as described above, it may be considered that the color filter 70 is not a fundamental requirement. However, the microresonator basically regulates only the wavelength of light that is incident from a direction perpendicular to the surface of the semi-transmissive film 69. Accordingly, the wavelength of light ejected from the microresonator is highly dependent on the viewing direction, such that different colors are likely to be detected when the panel is viewed at an angle. By providing the color filter 70 as in the present embodiment to pass the ejected light through the color filter 70, the obtained light would unfailingly have a specific wavelength. In this manner, the viewing angle dependency of the panel can be substantially eliminated.

The position of the color filter 70 is not limited to the top of the interlayer insulation film 15. Alternatively, the color filter 70 may be formed on the upper surface or the underside of the glass substrate 30. A light-shielding film is often provided on the upper surface of the glass substrate 30 in order to prevent external light from irradiating on the drive TFT. In such a case, the color filter 70 may be formed in the same layer as the light-shielding film to simplify the manufacturing process.

Figure 2:
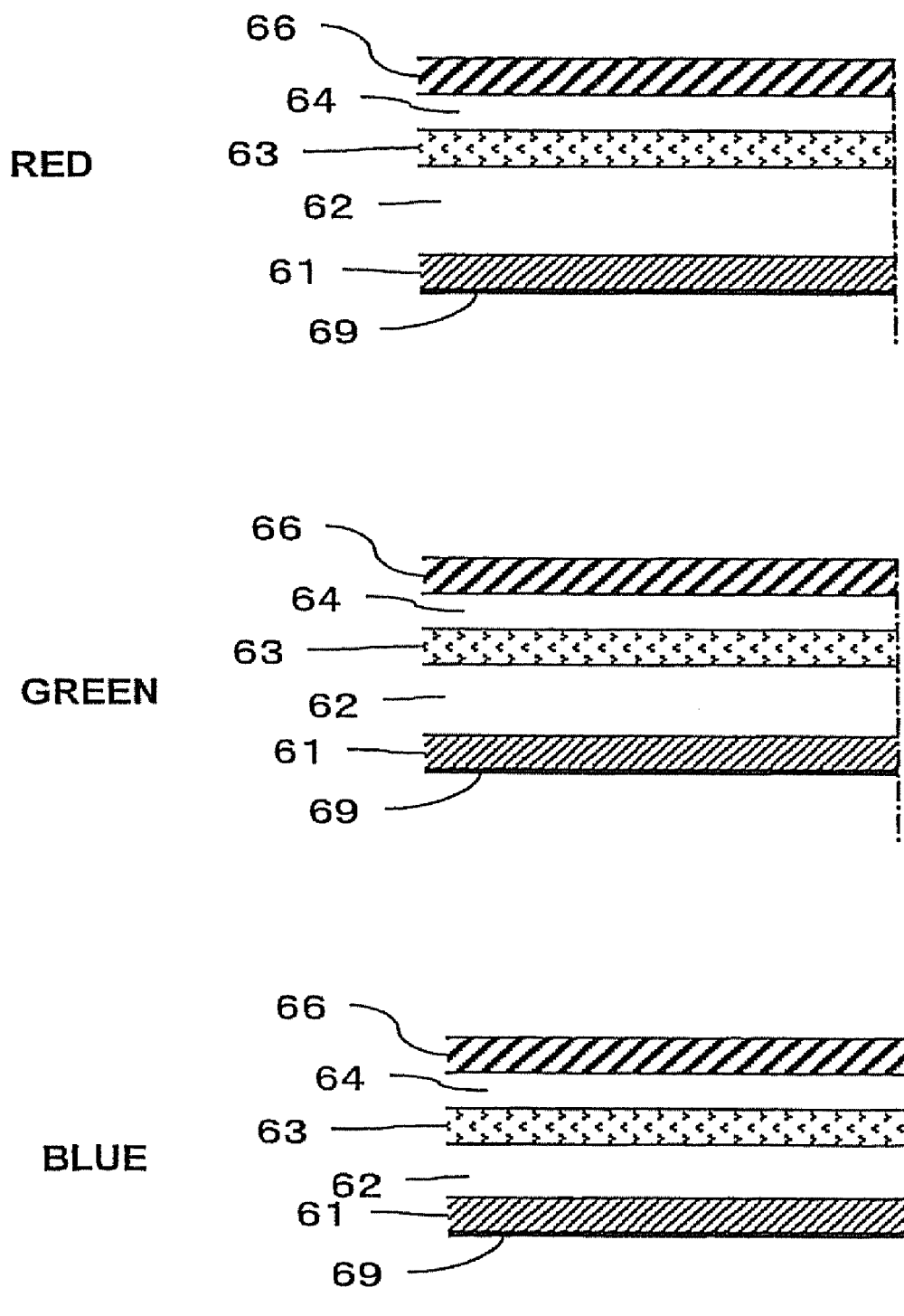
FIG. 2 shows an example configuration of organic EL elements for the respective colors of R, G, and B, according to the present invention.

FIG. 2 shows a configuration of pixel portions constituting the microresonators in R, G, and B pixels. In this example, resonance frequency is varied among the pixels of the respective colors of RGB by changing the thickness of the hole transport layer 62 in the decreasing order of R, G, and B. Thickness changes are made in the hole transport layer 62 because it is considered that a change in thickness of the hole transport layer 62 would have the least influence on the function compared to when such a change is made in the other layers.

By employing different emissive materials in the organic emissive layer 63, each pixel is designed to emit light of one color among R, G, and B. In each pixel, the optical length from the upper surface of the semi-transmissive film 69 to the underside of the cathode 66 is configured in accordance with the wavelength of the emitted color. Accordingly, in each pixel, light of the emitted color is intensified by the microresonator, thereby achieving an increase in emissive efficiency.

Further, because color filters 70 are provided, even if the optical length of a microresonator is slightly deviated from the predetermined value, the resulting minor variances in the wavelength of the ejected light do not cause any problems. Accordingly, control of the thickness of each layer constituting the microresonator can be facilitated.

When changing the thickness of the hole transport layer 62 for each color as in the present embodiment, it is preferable to form the hole transport layer 62 only in the necessary portion (display area) in each pixel, similarly to the organic emissive layer 63. Alternatively, it may be effective to change the thickness of the transparent electrode 61.

Figure 3:
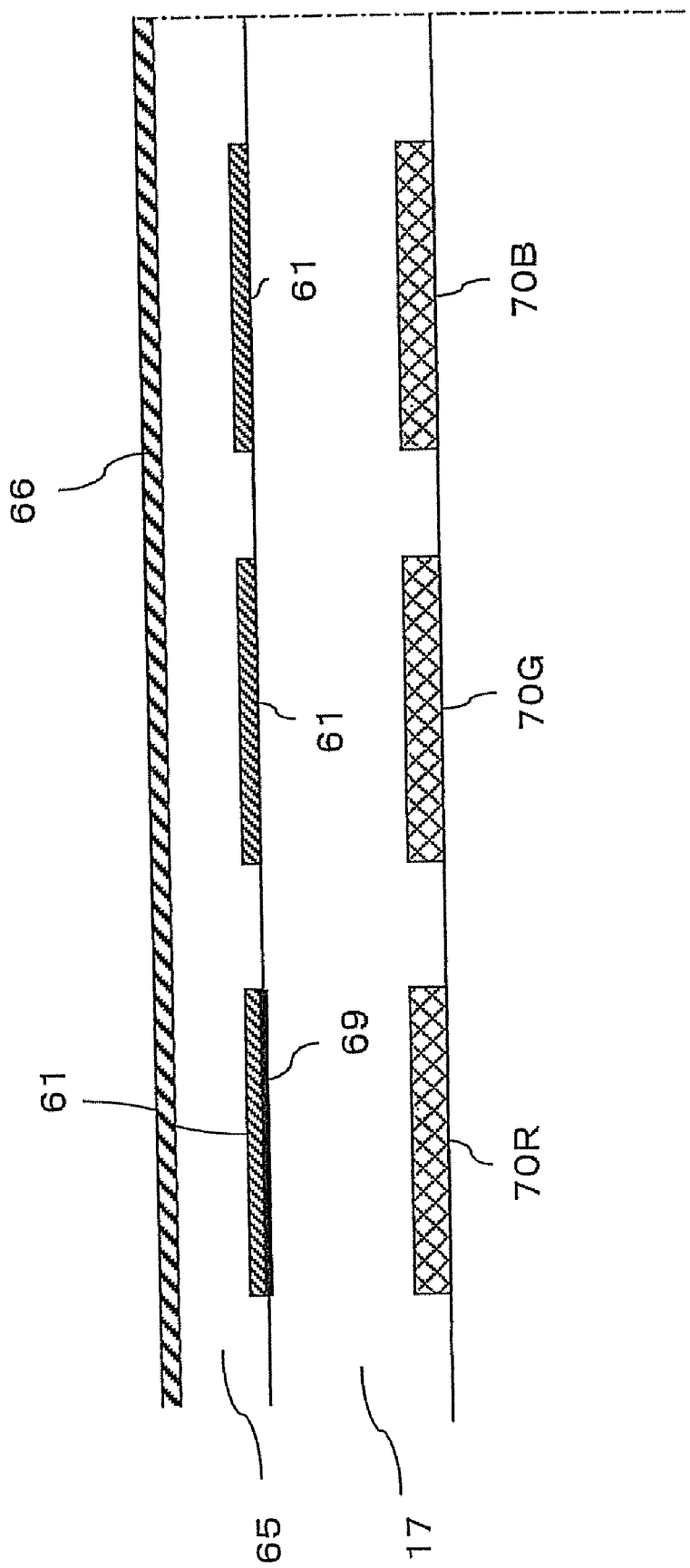
FIG. 3 shows another configuration of organic EL elements for the respective colors of R, G, and B, according to the present invention.

FIG. 3 diagrammatically shows three pixels of R, G, and B. As can be seen, the semi-transmissive film 69 is provided for the pixel of one color alone, while no semi-transmissive film is provided for the pixels of other colors. This arrangement is employed because the interval between the semi-transmissive film 69 and the counter electrode 66 is configured to form a microresonator for the one color alone (red R in the present example). In the pixel for the one color, light of this color is intensified and passed through the semi-transmissive film 69. In the pixels for the other colors, emitted light is ejected downward without further processing. Further, corresponding RGB color filters 70R, 70G, and 70B are provided for the respective pixels.

While light emission of the three colors of RGB can be achieved using different organic materials, each organic material has a different emissive efficiency (amount of light emission/current) By employing a microresonator for a pixel of the color having the lowest emissive efficiency so as to intensify the emitted light, a more uniform light emission can be accomplished, such that the life of organic EL elements can be equalized among different colors. Moreover, because the microresonator is formed for one color alone, the thickness of each layer constituting the microresonator can be set easily.

Figure 4:
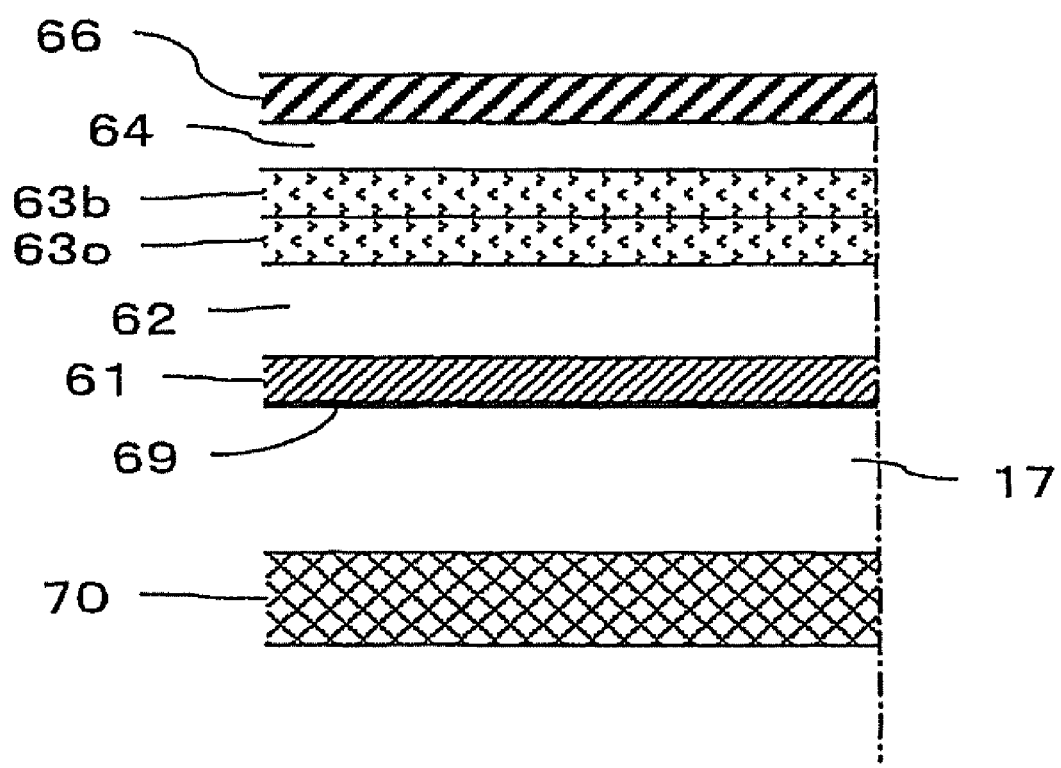
FIG. 4 shows a configuration of an organic EL element which emits white light.

Because the microresonator and the color filters 70 are provided in the present embodiment, the color of light emitted by each pixel can be white. In order to achieve emission of white light, the organic emissive layer 63 may be constituted with a two-layer structure including a blue emissive layer 63b and an orange emissive layer 63o, as shown in FIG. 4. According to this arrangement, holes and electrons combine in regions near the border between the two emissive layers 63b and 63o, thereby generating both blue light and orange light. The light of the two colors in combination are emitted as white light. The orange organic emissive layer 63o may be composed of materials such as NPB+DBzR.

Subsequently, in the present embodiment, light of a specific color among the emitted white light is intensified and selected using a microresonator, and further selected by a color filter 70 to be ejected.

When employing a white organic emissive layer 63 as described above, the organic emissive layer 63 can be formed over the entire surface, without the need to separately perform the emissive layer forming process for the pixels of different colors. The organic emissive material can be simply deposited without using masks. When adopting this configuration, it is preferable to control the thickness of the transparent electrode 61 in order to adjust the optical length of the microresonator. In this manner, all layers disposed above the transparent electrode 61 can be formed over the entire surface without using masks, further facilitating the panel manufacturing process.

Figure 5:
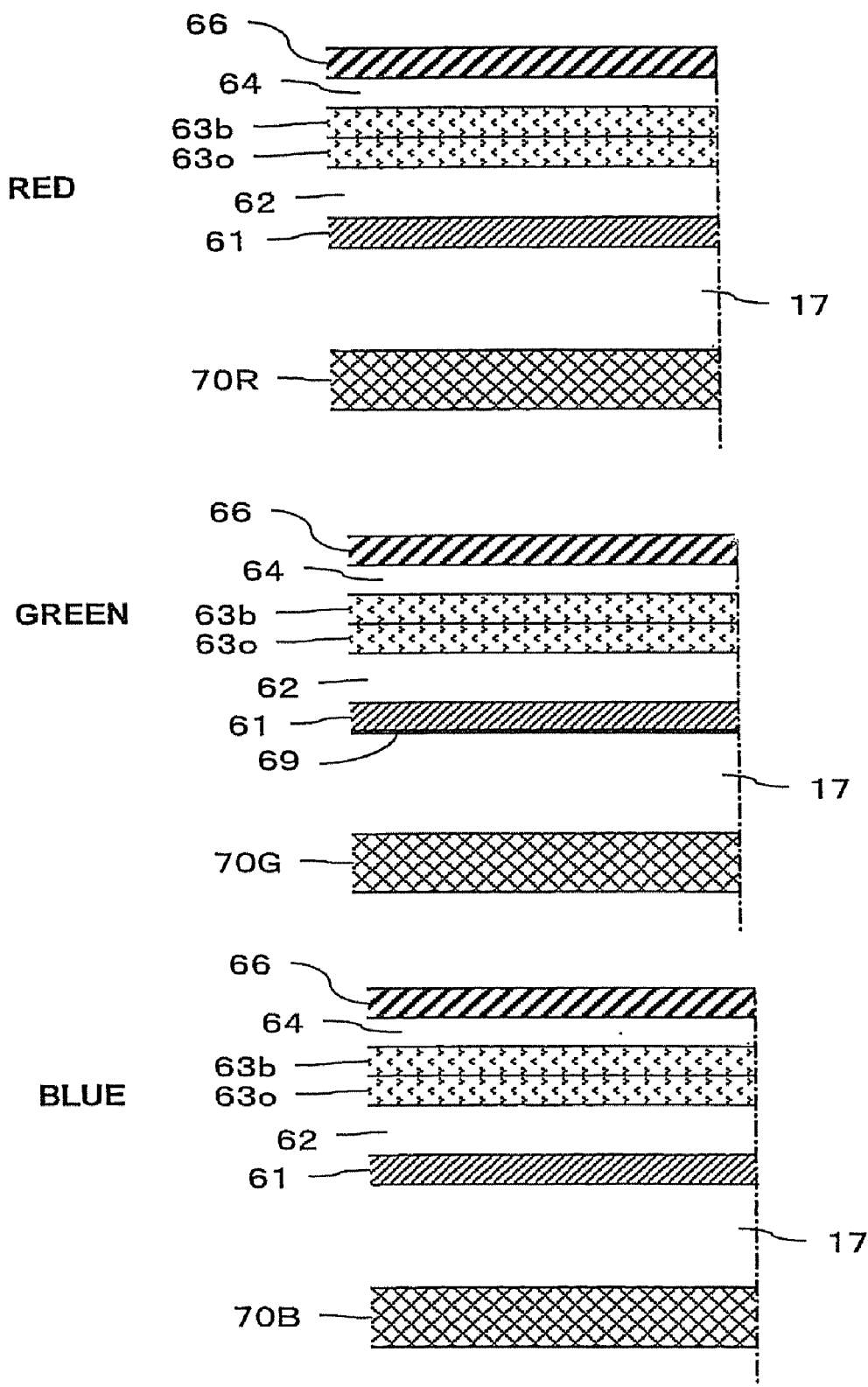
FIG. 5 shows an example configuration for the respective colors of R, G, and B using white-emitting organic EL elements, according to the present invention.

The present embodiment is more specifically illustrated in FIG. 5 showing the respective pixels of R, G, and B. As can be seen, the distance from the underside of the transparent electrode 61 to the underside of the cathode 66 is identical among all of the pixels. This distance is configured to have an optical length which selects and intensifies light of one color (green G, for example). In the pixel for this one color, the semi-transmissive film 69 is disposed beneath the transparent electrode 61. In the pixels of other colors (red R and blue B, for example), no semi-transmissive film is provided.

According to this arrangement, in the G pixel, the microresonator extracts a specific color (green) from among the emitted white light as described above, and the extracted light is passed and ejected through a green color filter 70. In the R and B pixels, the white light emitted from the organic emissive layer 63 is simply passed through the color filters 70 to be ejected as light of predetermined colors (red and blue, respectively).

Figure 6:
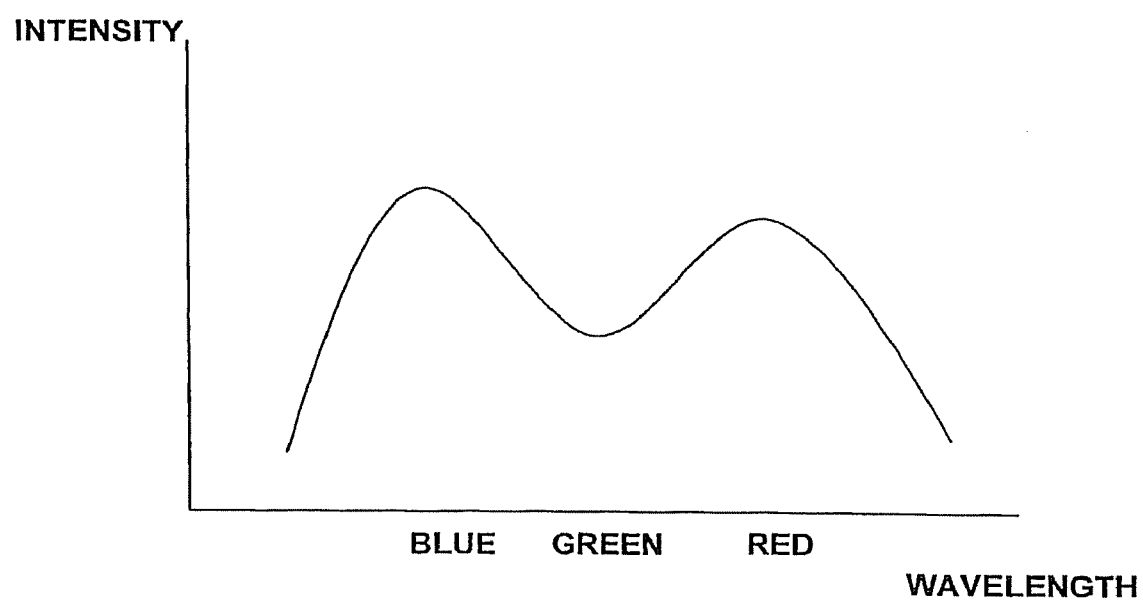
FIG. 6 is a diagram showing an example spectrum of a white-emitting organic EL element.

In this embodiment, the only difference among the pixels is whether or not the semi-transmissive film 69 is provided. Further, the optical length can be set easily, and the panel manufacturing process can be very much simplified. Moreover, light for one color can be intensified using the microresonator. When white light obtained by emission of two colors is used, one color among the three primary colors tends to have lower intensity compared to the other two colors. By employing the microresonator for the low-intensity color, a favorable color display can be achieved. For example, when light emission is executed by two emissive layers of blue and orange, the intensity of green light becomes lower than the other colors, as shown in FIG. 6. In order to equalize intensity, the semi-transmissive film 69 is provided for the green pixel so as to configure the microresonator to intensify the green light. In this manner, effective color display can be accomplished.

While the above-described embodiments refer to a bottom emission type panel in which light is ejected via the glass substrate 30, an EL panel according to the present invention may alternatively be configured as top emission type in which light is ejected via the cathode.

Figure 7:
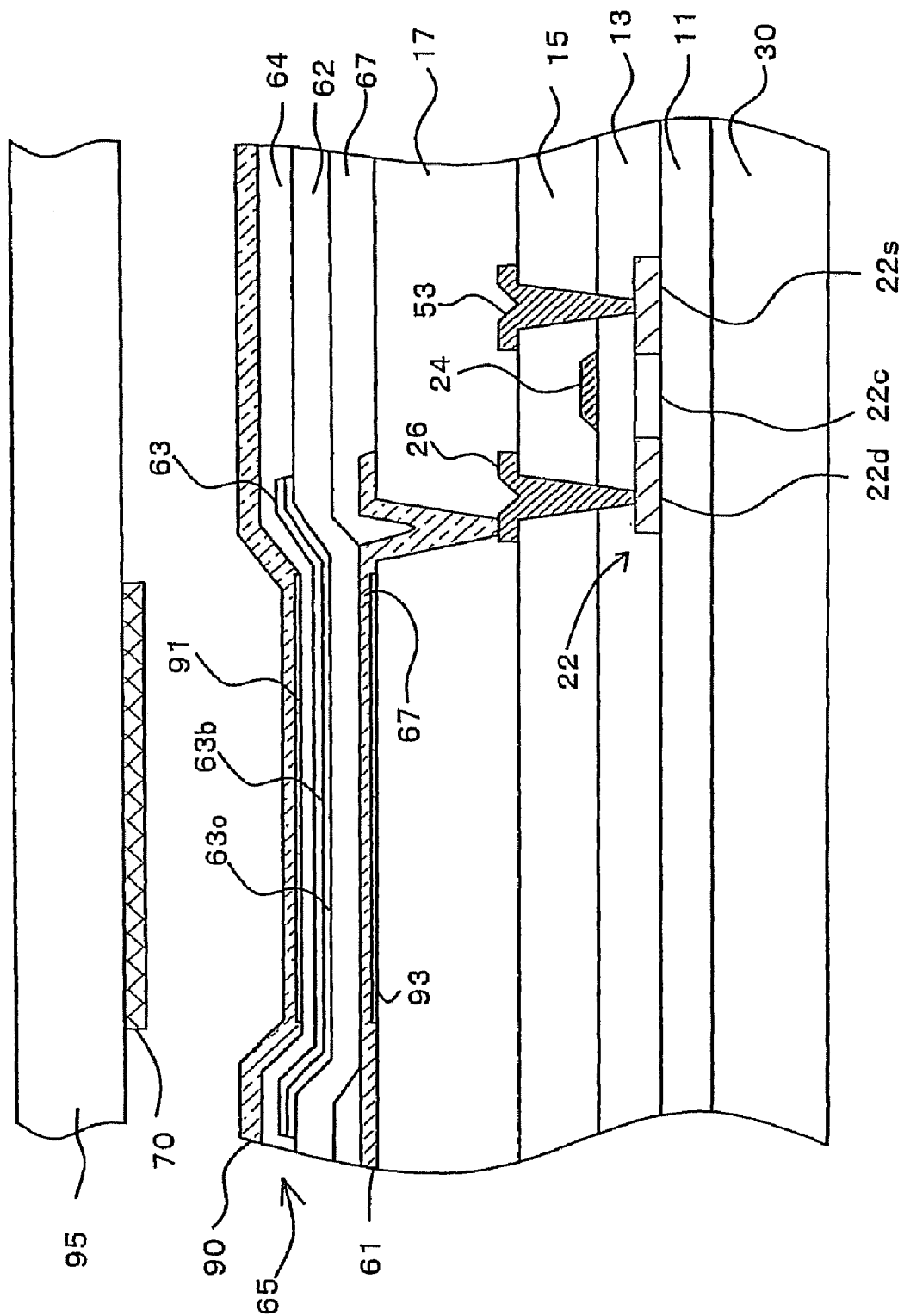
FIG. 7 shows an example configuration of a white-emitting organic EL element having a top-emission structure.

FIG. 7 shows a configuration of a pixel portion of a top emission type panel. In this example, a transparent cathode 90 composed of ITO is employed as the cathode. Further, a semi-transmissive film 91 is disposed on the underside of the transparent cathode 90.

Furthermore, a metal reflective layer 93 is formed under the transparent electrode 61. The interval structure between the surface of the metal reflective layer 93 and the semi-transmissive film 91 functions as the microresonator.

In this embodiment, the color filter 70 is provided on the underside of a sealing substrate 95. It should be noted that the sealing substrate 95 connects to the substrate 30 at its peripheral portion alone, and serves to seal the upper space of the substrate 30 having components such as the organic EL element formed thereon. The top emission structure shown in FIG. 7 can be employed in any of the above-described configurations according to the present invention.

While the TFTs in the above embodiments are described as top gate type TFTs, bottom gate type TFTs may alternatively be used.

FIGS. 8-11 diagrammatically illustrate example configurations of the present invention. To simplify explanation, only the characteristic structures are shown in these drawings.

Figure 8:
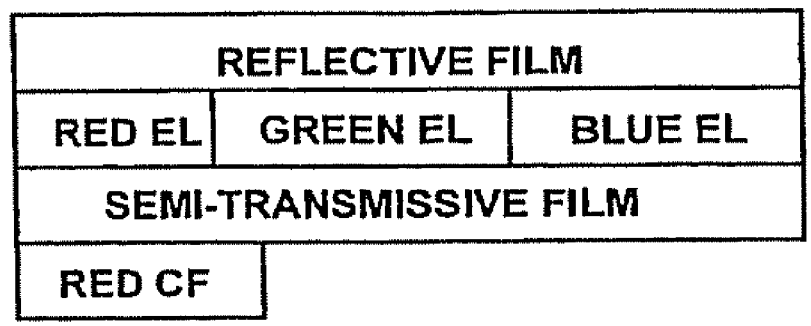

In FIG. 8, three types of organic emissive layers, namely, red emissive layer (red EL), green emissive layer (green EL), and blue emissive layer (blue EL) are employed. Further, corresponding to the red EL alone, a red color filter (red CF) is arranged. In this example, the color filter is provided for the color (red, in this case) having the highest dependency on viewing angle. It should be noted that it is also possible to provide a color filter for any of the other colors alone.

Figure 9:
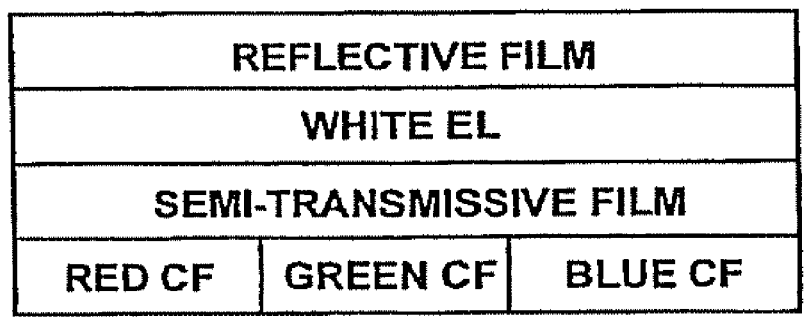

FIG. 9 shows an example in which color filters are arranged for all of the three colors. In this example, a white organic emissive layer (white EL) is provided as the organic emissive layer on the entire surface. Each of the pixels for the respective colors is provided with a microresonator along with a color filter of the corresponding color.

In FIG. 10, color filters are arranged for all of the three colors, while a red emissive layer (red EL), green emissive layer (green EL), and blue emissive layer (blue EL) are employed as the organic emissive layer. Each of the pixels for the respective colors is provided with a microresonator along with a color filter of the corresponding color.

In FIG. 11, an additional white pixel having a transparent electrode is provided in addition to the configuration of FIG. 9. By adding a white (W) pixel to RGB pixels as shown, a bright screen display can be easily achieved.

Figure 12:
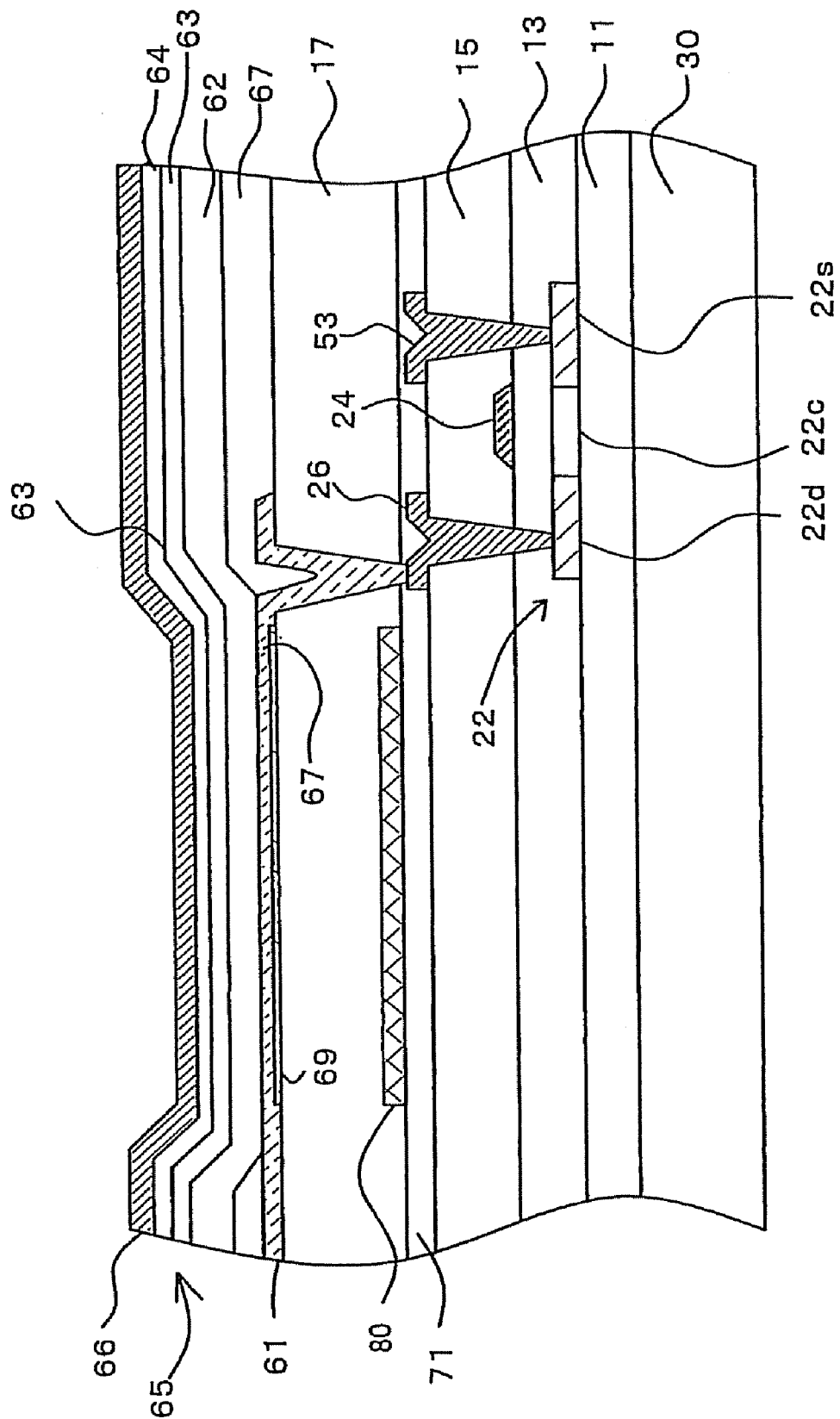
FIG. 12 is a cross-sectional view showing a configuration of a pixel portion of an organic EL element using a color conversion layer, according to the present invention.

FIG. 12 shows the configuration of FIG. 1 in which the color filter 70 is replaced with a color conversion layer 80. An example of this color conversion layer 80 is described in Japanese Patent Laid-Open Publication No. 2003-187975.

Using this color conversion layer 80, a specific color can be converted into another specific color. For example, light emitted by a blue emissive layer may be converted into red and green light. In this case, a single blue emissive layer 63 alone is formed as the organic emissive layer over the entire surface. Further, red and green pixels are provided with color conversion layers 80 for converting the emitted blue light into red and green light, respectively. Each of the RGB pixels can be realized in this manner.

Figure 13:
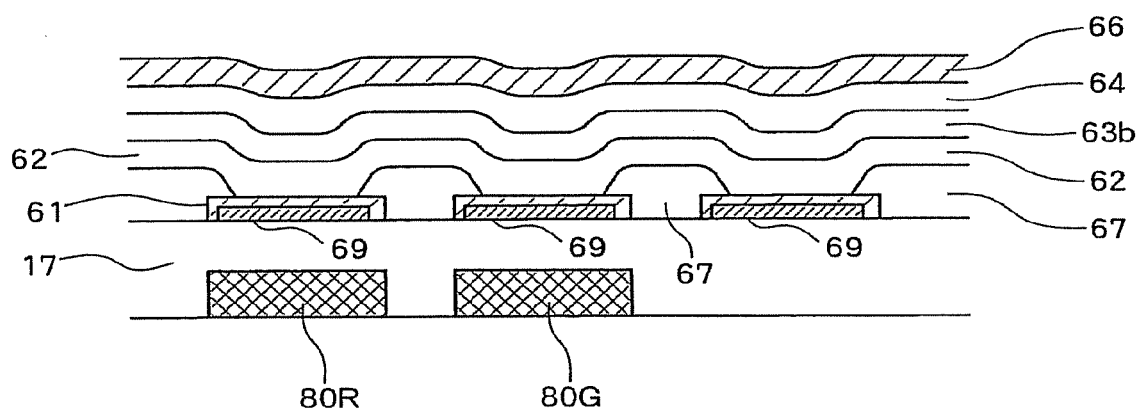
FIG. 13 is a schematic diagram showing an example RGB pixel configuration using color conversion layers, according to the present invention.

FIG. 13 shows an example configuration of three pixels of RGB. It should be noted that FIG. 13 is a schematic diagram in which the TFT structure and the structure connecting the TFT and the transparent electrode 61 are not shown.

A color conversion layer 80R for converting blue light into red light is arranged below the transparent electrode 61 in a red pixel, while a color conversion layer 80G for converting blue light into green light is arranged below the transparent electrode 61 in a green pixel. A blue pixel does not include any color conversion layer.

The hole transport layer 62, blue organic emissive layer 63b, electron transport layer 64, and counter electrode 66 are formed extensively over the entire surface so as to serve commonly for all pixels.

Microresonators are formed in the respective pixels by the layers between the semi-transmissive film 69 and the counter electrode 66. In the present example, because the microresonators only need to intensify blue light, the interval between the semi-transmissive film 69 and the counter electrode 66 can be made identical in all of the pixels.

According to this arrangement, all of the hole transport layer 62, organic emissive layer 63 (63b), and electron transport layer can be formed extensively over the entire substrate (commonly for all pixels), thereby simplifying the manufacturing process.

What is claimed is:

1. A light-emitting device comprising:
   a light-emitting element including first and second electrodes and an emissive layer provided between the first and second electrodes, and emitting light of a predetermined color when a voltage is applied between the first and second electrodes to allow a current to flow in the emissive layer;
   a microresonator for repetitively reflecting light of the predetermined color emitted from the emissive layer within an interval having an optical length corresponding to the predetermined color, and thereby intensifying and selecting the light of the predetermined color; and
   a color filter for passing the light intensified and selected by the microresonator and further limiting to light having a wavelength of the predetermined color.

2. The light-emitting device according to claim 1, wherein the light-emitting element is an organic EL element, and the emissive layer is an organic layer.

3. The light-emitting device according to claim 1, wherein the predetermined color is one of red, green, and blue.

4. The light-emitting device according to claim 2, wherein the first electrode includes a semi-transmissive layer, which reflects light from the organic layer,
   the second electrode includes a reflective layer for reflecting light from the organic layer,
   an interval between the reflective layer and the semi-transmissive layer is configured to have a predetermined optical length, such that when light generated in the organic layer is repetitively reflected between the reflective layer and the semi-transmissive layer, the interval between the reflective layer and the semi-transmissive layer functions as a microresonator which intensifies and selects light of the predetermined color and ejects the selected light through the semi-transmissive layer.

5. The light-emitting device according to claim 4, wherein the first electrode has a laminated structure composed of the semi-transmissive layer and a transparent electrode, and the second electrode is a metal electrode which functions as the reflective layer.

6. The light-emitting device according to claim 2, wherein the organic layer includes a hole transport layer, and a thickness of the hole transport layer is determined based on a color of light emitted by a pixel.

7. A display panel comprising a plurality of pixels arranged in a matrix, wherein each pixel includes:
   a light-emitting element including first and second electrodes and an emissive layer provided between the first and second electrodes, and emitting light of a predetermined color when a voltage is applied between the first and second electrodes to allow a current to flow in the emissive layer;
   a microresonator for repetitively reflecting light of the predetermined color emitted from the emissive layer within an interval having an optical length corresponding to the predetermined color, and there by intensifying and selecting the light of the predetermined color; and
   a color filter for passing the light intensified and selected by the microresonator and further limiting to light having a wavelength of the predetermined color.

8. The display panel according to claim 7, wherein the light-emitting element is an organic EL element, and the emissive layer is an organic layer.

9. The display panel according to claim 8, wherein
   the predetermined color is one of red, green, and blue, and the plurality of pixels arranged in a matrix include a pixel having an organic EL element for red, a pixel having an organic EL element for green, and a pixel having an organic EL element for blue.

10. The display panel according to claim 9, wherein
    the first electrode includes a semi-transmissive layer which reflects light from the organic layer,
    the second electrode includes a reflective layer for reflecting light from the organic layer,
    an interval between the reflective layer and the semi-transmissive layer is configured to have a predetermined optical length, such that when light of one color among red, green, and blue generated in the organic layer is repetitively reflected between the reflective layer and the semi-transmissive layer, the interval between the reflective layer and the semi-transmissive layer functions as a microresonator which intensifies and selects
    the light of one color among red, green, and blue and ejects the selected light through the semi-transmissive layer.

11. The display panel according to claim 10, wherein
    the first electrode has a laminated structure composed of the semi-transmissive layer and a transparent electrode, and the second electrode is a metal electrode which functions as the reflective layer.

12. The display panel according to claim 9, wherein
    the pixels arranged in a matrix are of at least three types including a pixel which emits light of red, a pixel which emits light of green, and a pixel which emits light of blue, and the optical length of the microresonator for each pixel is set corresponding to a wavelength of light to be emitted.

13. The display panel according to claim 12, wherein the optical length of the microresonator is determined by a thickness of the organic layer.

14. The display panel according to claim 13, wherein
    the organic layer includes a hole transport layer, and a thickness of the hole transport layer is determined based on a color of light emitted by a pixel.

* * * * *